(12) United States Patent
Pandey et al.

(10) Patent No.: US 9,384,801 B2
(45) Date of Patent: Jul. 5, 2016

(54) THRESHOLD VOLTAGE EXPANSION

(71) Applicant: INTEL CORPORATION, Santa Clara, CA (US)

(72) Inventors: Abhinav Pandey, Boise, ID (US); Hanmant P. Belgal, El Dorado Hills, CA (US); Prashant S. Damle, Hillsboro, OR (US); Arjun Kripanidhi, Mountain View, CA (US); Sebastian T. Uribe, El Dorado Hills, CA (US); Dany-Sebastien Ly-Gagnon, Santa Clara, CA (US); Sanjay Rangan, Boise, ID (US); Kiran Pangal, Fremont, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/461,154

(22) Filed: Aug. 15, 2014

(65) Prior Publication Data

US 2016/0049209 A1    Feb. 18, 2016

(51) Int. Cl.
*G11C 7/00* (2006.01)
*G11C 7/12* (2006.01)
*G11C 29/50* (2006.01)
*G06F 11/10* (2006.01)
*G11C 14/00* (2006.01)
*G11C 7/04* (2006.01)
*G11C 13/00* (2006.01)

(52) U.S. Cl.
CPC .............. *G11C 7/12* (2013.01); *G06F 11/1072* (2013.01); *G11C 7/04* (2013.01); *G11C 13/0004* (2013.01); *G11C 14/0045* (2013.01); *G11C 29/50004* (2013.01); *G11C 13/0002* (2013.01); *G11C 2029/5004* (2013.01)

(58) Field of Classification Search
CPC ............. G11C 11/419; G11C 13/0002; G11C 13/0004; G11C 13/004; G11C 16/0483; G11C 2013/0054; G11C 2013/0057; G06F 11/0793
USPC ....................... 365/163, 148, 189.011, 189.15
See application file for complete search history.

(56) References Cited

U.S. PATENT DOCUMENTS

| | | |
|---|---|---|
| 2006/0050548 A1 | 3/2006 | Oh et al. |
| 2009/0052236 A1* | 2/2009 | Bae ........................ G11C 11/56 365/163 |
| 2009/0273970 A1 | 11/2009 | Fuji |
| 2010/0124102 A1 | 5/2010 | Lee et al. |
| 2012/0327708 A1* | 12/2012 | Du ..................... G11C 13/0021 365/163 |
| 2013/0040584 A1 | 2/2013 | Bedeschi |
| 2014/0098593 A1 | 4/2014 | Calderoni et al. |
| 2015/0255150 A1* | 9/2015 | Kim ..................... G11C 13/004 365/148 |
| 2015/0302937 A1* | 10/2015 | Roberts ................. G11C 29/00 365/201 |

OTHER PUBLICATIONS

Korean Intellectual Property Office (as ISA); International Search Report and Written Opinion for PCT/US2015/034290; Sep. 1, 2015; 10 pages.

* cited by examiner

*Primary Examiner* — Fernando Hidalgo
(74) *Attorney, Agent, or Firm* — Schwabe Williamson & Wyatt PC

(57) ABSTRACT

Embodiments including systems, methods, and apparatuses associated with expanding a threshold voltage window of memory cells are described herein. Specifically, in some embodiments memory cells may be configured to store data by being set to a set state or a reset state. In some embodiments, a dummy-read process may be performed on memory cells in the set state prior to a read process. In some embodiments, a modified reset algorithm may be performed on memory cells in the reset state. Other embodiments may be described or claimed.

22 Claims, 6 Drawing Sheets

THRESHOLD VOLTAGE EXPANSION

FIELD

Embodiments of the present invention relate generally to the technical field of memory. Specific embodiments include processes of altering bias drift in memory cells and associated configurations.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

In a non-volatile memory, which may be referred to as a cross-point non-volatile memory and may include, for example, a phase change memory (PCM), memory cells of the PCM may typically be set to a first threshold voltage or a second threshold voltage, dependent upon the data being stored in the memory cell. The first threshold voltage may correspond to a first state of the memory cell, and the second threshold voltage may correspond to a second state of the memory cell. In order to identify which of the two states the memory cell is in, a read voltage may be applied to the memory cell, and compared to the threshold voltage of the memory cell. Based on that comparison, the state of the memory cell may be identified. However, in some embodiments the threshold voltages may shift over time, a phenomenon referred to as "drift."

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Figure 1:
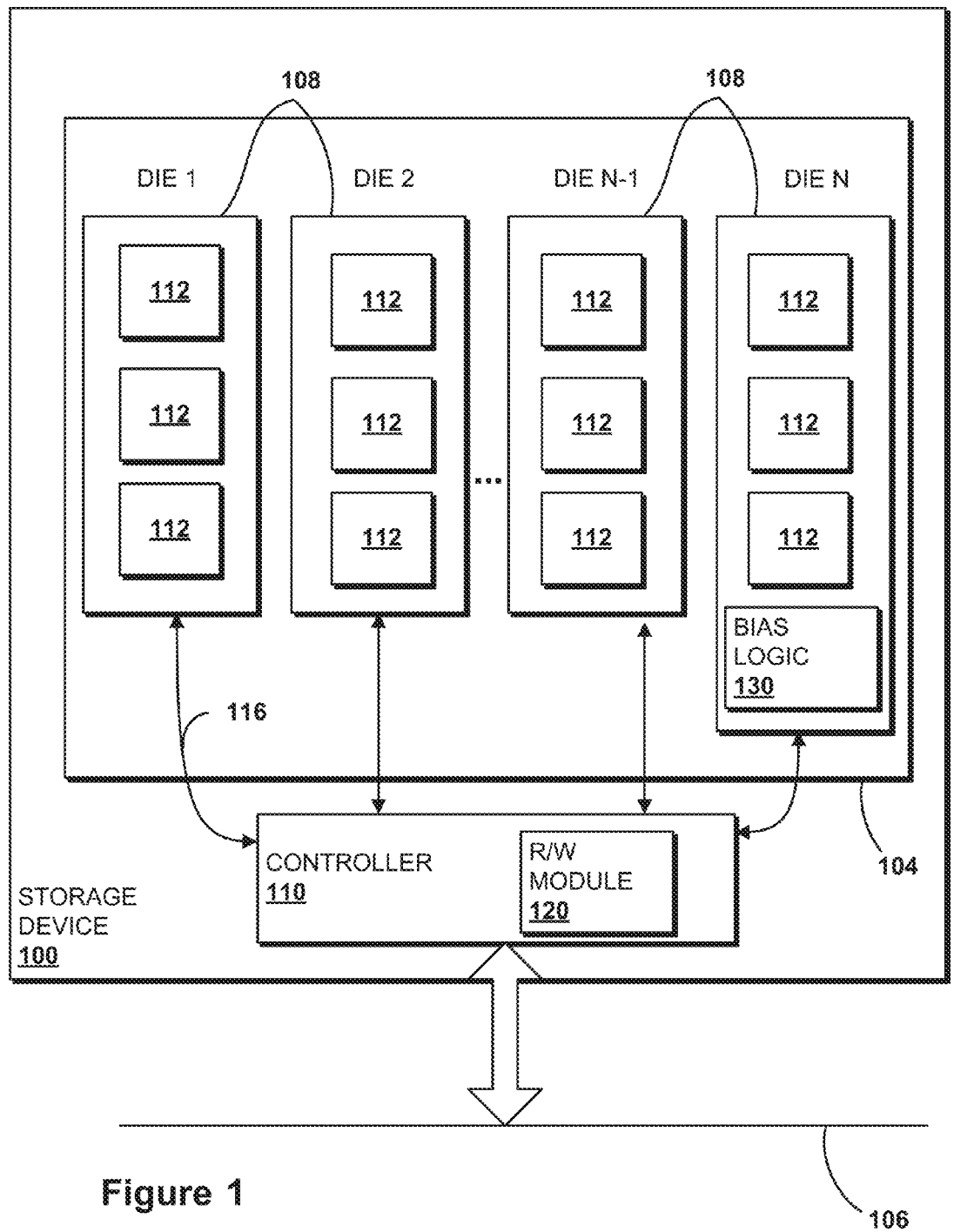
FIG. 1 illustrates an example PCM, in accordance with various embodiments.

With reference to FIG. 1, in various embodiments, a storage device 100 may include a non-volatile memory 104 such as PCM. Information may be written to and/or read from the non-volatile memory 104 by a memory controller 110. The memory controller 110 may be coupled with the non-volatile memory 104 by way of one or more communication lines 116, e.g., a memory bus. The read or write operations may be respectively performed by read logic or write logic which may be separate from one another, or combined such as read/write (R/W) module 120. For the purposes of this discussion, the read/write module 120 will be discussed, and may be assumed to include both the read logic and the write logic. However in other embodiments a read module may contain the read logic and perform the read operations discussed below, and a write module may include the write logic and perform the write operations discussed below, and the read module and the write module may be separate from one another.

As shown, the read/write module 120 may be an element of the memory controller 110, while in some embodiments the read/write module 120 (or a separate read module and/or write module) may be separate from, but communicatively coupled to, the memory controller 110. In some embodiments (not shown) the read/write module 120 may be an element of, or otherwise coupled with, the non-volatile memory 104. In some embodiments (not shown) the read/write module 120 may be distributed across one or more of the memory controller 110, the non-volatile memory 104, and/or one or more of the dies 108. In some embodiments, the read/write module 120 may be implemented as hardware, firmware, software, or some combination thereof. In embodiments, the read/write module 120 may be configured to perform a read operation to read voltage values of one or more memory cells 112 of the non-volatile memory 104, as described below. In embodiments, the voltage value of a memory cell 112 of the non-volatile memory 104 may be considered the value of the voltage measured across the memory cell 112 during a read operation by the read/write module 120, as described in further detail below.

In some embodiments, the storage device 100 may further include bias logic 130 as shown in FIG. 1. In some embodiments, the bias logic 130 may be implemented as hardware, software, firmware, or a combination thereof on one or more of the die 108. In some embodiments, each of die 108 may have bias logic 130, while in other embodiments the bias logic 130 may be located on only one of the die 108, or it may be distributed across multiple die 108. In some embodiments, if the bias logic 130 is located on only one of the die 108, it may be able to perform one or more bias processes or operations for others of the die 108, as described below. In some embodiments, the bias logic may be located on, or distributed across, one or more of the non-volatile memory 104, the controller 110, the read/write module 120, and/or the storage device 100.

In some embodiments, the memory controller 110 and/or storage device 100 may be coupled with other components of a computing system via one or more external communication lines 106 such as a peripheral component interconnect (PCI) or PCI express bus. Although not depicted, various other components may be coupled with storage device 100 via one or more communication lines 106, including but not limited to one or more central processing units (CPUs), volatile memory (e.g., dynamic random access memory (DRAM)), one or more input/output (I/O) devices, alternative processing units (e.g., graphics processors), and so forth. In various embodiments, storage device 100 may be a solid state drive (SSD) or hybrid hard drive (HHD).

In many cases, including the example of FIG. 1, the non-volatile memory 104 may include a plurality of die 108. For example, in FIG. 1, the non-volatile memory 104 includes N die 108. N may be any positive integer. In other embodiments, the non-volatile memory 104 may only include a single die 108. As shown in FIG. 1, each die 108 may have one or more memory cells 112. It will be understood that although three memory cells 112 are shown per die 108, each die may have more or fewer memory cells 112. Additionally, each die 108 does not necessarily have to have the same amount of memory cells 112 as another die 108. Finally, the data may be arranged in different groupings as described herein, for example, the memory cells 112 may be arranged as blocks or pages of memory.

As described above, non-volatile memory such as non-volatile memory 104, or each die of a non-volatile memory such as die 108 of non-volatile memory 104, may include a plurality of memory cells arranged into a two- or three-dimensional grid. Specifically, non-volatile memory such as non-volatile memory 104, which may be a PCM, may be constructed of chalcogenide glass. In some embodiments, the non-volatile memory 104 may be formed of, or include, alloys or elements such as Germanium (Ge), Tellurium (Te), Antimony (Sb), Arsenic (As), Silicon (Si), Sulfur (S), Indium (In), Silver (Ag), Selenium (Se), or other elements. For example, the non-volatile memory may include phase change alloys formed within various systems such on the pseudobinary line between GeTe and Sb2Te3, such as $Ge_2Sb_2Te_5$, referred to as GST, or the Te—As—Si—Ge system, or the Te—Ge—Sb—S system, or the As—Te—In system, or InSbTe, referred to as IST, or combinations thereof, including these alloys doped with various elements such as Ag, In, Si, Se, or Ge, but not limited to these elements. Other materials may be used in non-volatile memory, however for ease of explanation only chalcogenide glass will be discussed below as an example. Specifically, each memory cell such as memory cells 112 may be a separate discrete element of chalcogenide glass. If the chalcogenide glass of a memory cell 112 is quickly heated and then quenched, then the chalcogenide glass may be in a physical state known as an "amorphous" state. By contrast, if the chalcogenide glass of a memory cell 112 is held at a certain temperature for a given amount of time, then the chalcogenide glass may crystalize and be in a physical state known as a "crystalline" state. In embodiments, the heating process may be directed or performed by a writer such as read/write module 120, and be performed by running a current through a given memory cell 112 for a given amount of time, as described in further detail below. The natural electrical resistance of the chalcogenide glass may create heat in the memory cell 112, and result in the described phase change of the memory cell 112.

In embodiments, a memory cell 112 in an amorphous state may have a different electrical resistance than a memory cell 112 in a crystalline state. For example, a memory cell 112 in an amorphous state may have a relatively high electrical resistance, and exist in a "reset" state. By contrast, a memory cell 112 in a crystalline state may have a relatively low electrical resistance, and exist in a "set" state. In embodiments, the "set" state and the "reset" state may respectively correspond to a logical "1" and a logical "0," or vice versa.

In some embodiments, the read/write module 120 may set a memory cell 112 to the reset state with a "reset pulse." As noted above, the read/write module 120 may be configured to set the memory cell 112 in the reset state by quickly heating and then quenching the memory cell 112. Specifically, the read/write module 120 may apply the reset pulse to the memory cell 112 for a fixed period of time.

In order to read the logical value of a memory cell 112, a voltage, known as a "read voltage," may be applied across the memory cell 112, for example, by the read/write module 120, resulting in a current flowing through the cell. If the read voltage is above a value known as a "threshold voltage" ("$V_T$"), then application of the read voltage may cause the memory cell 112 to conduct and a relatively large amount of current may flow through the memory cell 112. If the read voltage is below the threshold voltage, then application of the read voltage may cause the memory cell to act as an insulator and little to no current may flow through the memory cell 112.

Specifically, because voltage is equal to current multiplied by resistance, and a memory cell 112 in the set state may have a different resistance than a memory cell 112 in the reset state, the threshold voltage of the memory cell 112 may be different dependent on the state the memory cell 112 is in. For example, a set state of a memory cell 112 may be indicated by a relatively low threshold voltage, while a reset state of a memory cell 112 may be indicated by a relatively high measured voltage across the memory cell 112. Typically, the read voltage may be set between the relatively low threshold voltage of the set state, and the relatively high threshold voltage of the reset state.

Because a specific state of the chalcogenide glass may result in a specific resistance, which may result in specific threshold voltage, it may be desirable to set the physical state of each memory cell 112 so that the memory cell 112 produces a specific threshold voltage for the set or reset states.

Specifically, the operation to alter the physical properties of a memory cell 112 to have a given threshold voltage may be known as a write operation. In embodiments, the read/write module 120 may perform a write operation to change the physical properties of the chalcogenide glass of one or more memory cells 112 so that each memory cell 112 that is set to the set state will have the same electrical resistance, and therefore the read/write module 120 may identify the same relatively low voltage value across each memory cell 112 in the set state. Similarly, the read/write module 120 may perform a write operation to change the physical properties of the chalcogenide glass of one or more memory cells 112 so that each memory cell 112 that is set to the reset state will have the same electrical resistance, and therefore the read/write module 120 may read the same relatively high voltage value across each memory cell 112 in the reset state.

Figure 2:
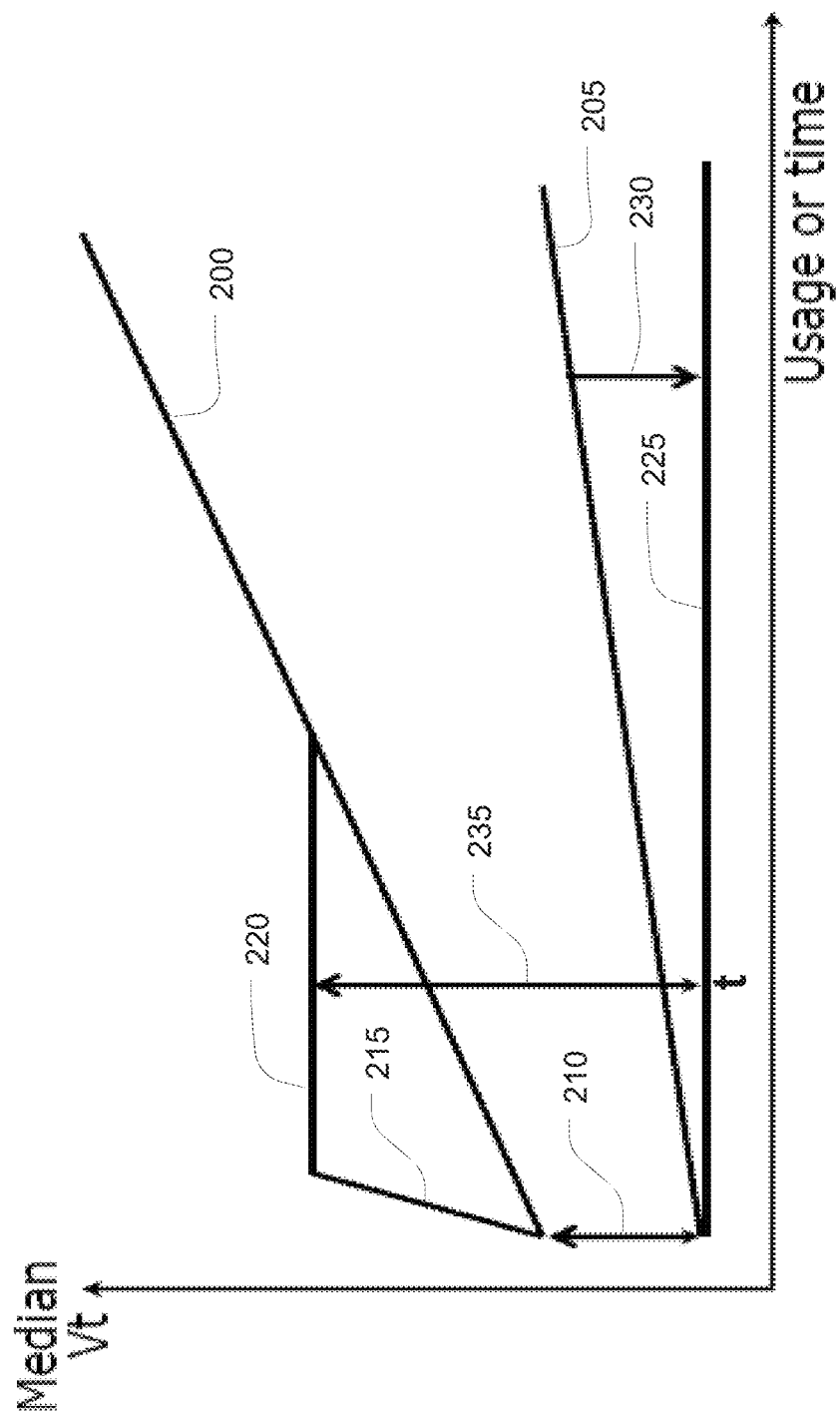
FIG. 2 illustrates an example of a threshold voltage window, in accordance with various embodiments.

In some embodiments, the physical structure of a memory cell 112 may relax over time, resulting in drift. As described above, drift may refer to a change in a threshold voltage of a cell 112. FIG. 2 depicts an example of increasing drift. Specifically, FIG. 2 depicts time on the x-axis, and threshold voltage on the y-axis. In FIG. 2, a first line 200 depicts the drift of a threshold voltage for a memory cell in a reset state. A second line 205 depicts the drift of threshold voltage for a memory cell in a set state. Spacer 210 indicates the difference between lines 200 and 205, which may be referred to as a voltage window.

As noted above, in a read operation, it may be desirable for the read voltage to be between the threshold voltage of memory cells in the set state and memory cells in the reset state. Therefore, in some embodiments it may be desirable for the distance between lines 200 and 205 to be relatively large. This may be particularly true because, for a memory such as non-volatile memory 104 with the plurality of memory cells 112, the threshold voltage of each cell in a given state may not be exactly equal. As will be described in further detail below, in some embodiments the threshold voltage of memory cells in a given state may be identified by a probability density function (PDF). In embodiments, a PDF may look similar to a bell curve, having a median threshold voltage at an apex of the PDF, with decreasing values on either side of the meeting. If the median threshold voltages of the set state and the reset state are relatively close together, then the outlying distribution of the PDFs of those two states may overlap and result in a read error. For example, a memory cell may be identified as being in a set state when it is in fact intended to be in a reset state.

It has been observed that drift may be accelerated by application of a voltage bias pulse that has a given magnitude and is applied for a given length of time (referred to as "width"). In other words, the application of a voltage bias pulse by bias logic 130 may accelerate the drift of memory cells 112 in the reset state, causing the memory cells to have a higher threshold voltage more quickly than they would without the application of the voltage bias pulse. This process of applying a voltage bias pulse by bias logic 130 may be referred to as a modified reset algorithm. In embodiments, the application of the voltage bias pulse by bias logic 130 may follow the application of the reset pulse to the memory cells, e.g. the voltage bias pulse may be applied immediately following performance of a memory reset operation on the memory cell. In some embodiments the magnitude of the voltage, and the length of time in which the voltage bias is applied, may increase or decrease the acceleration of the bias drift. In general, a higher magnitude of voltage or longer application of the voltage bias may accelerate the bias drift.

The bias drift acceleration can be seen in FIG. 2 with reference line 215. As shown, line 215 has a higher slope than line 200, which may represent the threshold voltage of a memory cell in the reset state without application of the voltage bias. The voltage bias pulse may be applied as shown with reference line 215 until such time as it is turned off and the drift of the memory cell may plateau, as shown in line 220. This plateau may continue until such time as the memory cell generally returns to the increase seen in the bias drift at line 200 without application of a voltage bias pulse.

Figure 3:
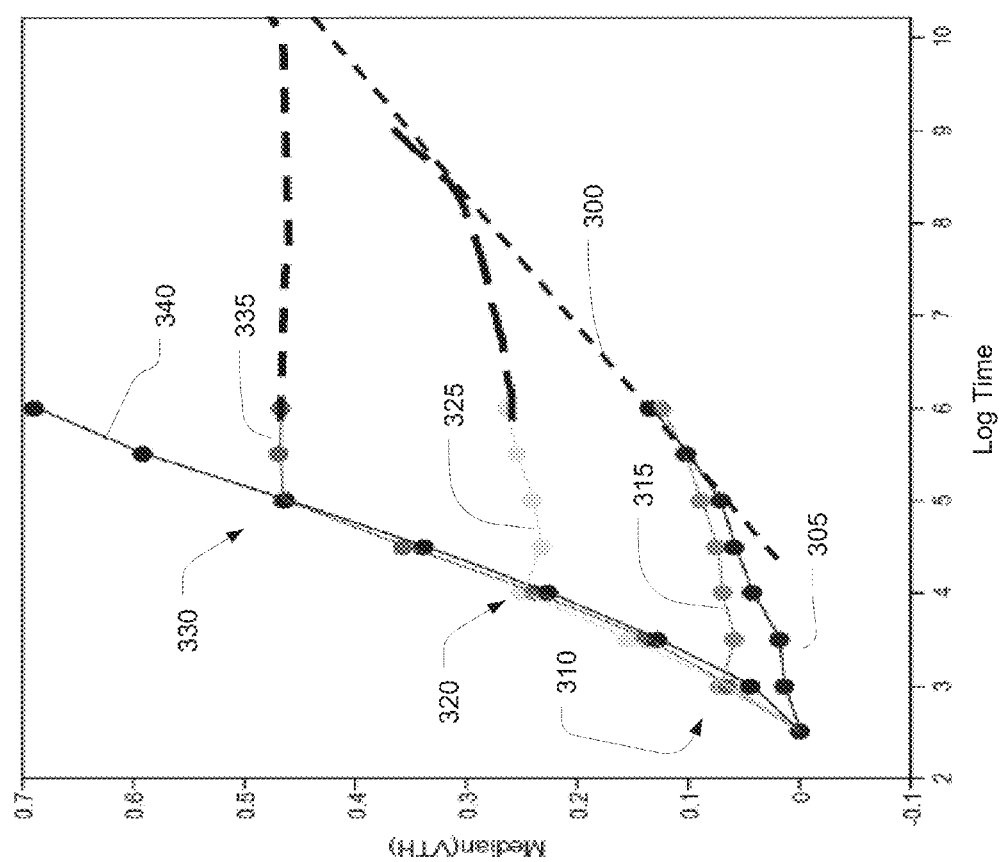
FIG. 3 illustrates an example of application of a voltage bias to a memory cell, in accordance with various embodiments.

In other words, once a voltage bias pulse is removed, the voltage threshold of the memory cell 112 in the reset state may not shift until such a time period has passed to allow the memory cell 112 to reach the post bias state without the voltage bias. This may be seen with reference to FIG. 3. Specifically, FIG. 3 depicts experimental results of application of a voltage bias to a memory cell such as memory cells 112. Specifically, the circles depicted in FIG. 3 represent experimental results, while the dashed lines, such as line 300 or the dashed lines shown as part of lines 325 or 335, represent theoretical abstractions of the experimental results. The median voltage threshold of the memory cells is depicted along the y-axis, while time is depicted in a logarithmic scale along the x-axis.

Specifically, reference line 300 depicts the normal drift of a memory cell without application of a voltage bias pulse. Line 340 depicts the drift of the memory cell with the application of the voltage bias. Line 305 depicts application of the voltage bias almost immediately turned off, causing the voltage threshold of the memory cell to move almost laterally to line 300. By contrast, line 315 is the result of application of the voltage bias until position 310, at which point the voltage bias is turned off. As can be seen, the memory cell then moves relatively laterally to rejoin line 300 asymptotically. Similarly, line 325 depicts application of the voltage bias until position 320, at which point the memory cell moves relatively laterally to rejoin 300 asymptotically. Similarly line 335 depicts an example of application of voltage bias until position 330, at which point voltage bias is turned off, and the memory cell again moves relatively laterally to rejoin line 300.

In embodiments, the reset pulse may be application of the specific current over a given period of time. In other words, the voltage across a cell may be modulated to keep the current constant. By contrast, the voltage bias pulse may involve application of a given voltage over a certain period of time. In embodiments, the magnitude of the voltage bias pulse may be relatively low, for example, less than the threshold voltage of the set state or the reset state. In embodiments, the voltage bias pulse may result in a very low current, or no current, flowing through the memory cells 112.

In some embodiments, the voltage bias pulse may be applied by the bias logic 130 as a regular read pulse that is applied to both the wordline and the bitline of the non-volatile memory 104. In other embodiments, the voltage bias pulse may be applied to only the wordline, or only the bitline.

Additionally, as noted above, in many embodiments the reset pulse may precede the voltage bias pulse. In embodiments, the reset pulse may have a relatively short time, for example, less than 1 microsecond ("µs"), therefore allowing additional time to apply the voltage bias pulse during a relatively longer programming command such as a write pulse. As an example, in some embodiments it may be deduced that for every 1 Volt increase in the magnitude of the voltage bias pulse, the length of time that the voltage bias pulse needs to be applied may decrease by a factor of 10. In some embodiments, application of a voltage bias pulse with a given magnitude of 4.8 V and a relatively short length of time, for example less than 1 second long, may cause the voltage threshold of a memory cell in the reset state to increase by approximately 200 millivolts ("mV"). In some embodiments, the voltage bias pulse may be applied outside of a normal write command cycle, for example, at an opportune time by the read/write module 120, or the memory controller 110.

As noted above, in some embodiments the threshold voltage of memory cells 112 in the reset state may experience drift as shown in FIG. 2 with respect to line 200. However, the threshold voltage of memory cells 112 in the set state may also experience drift as shown in FIG. 2 with respect to line 205. However, it has been observed that when a memory cell is "thresholded" (aka snapped-back or turned "ON"), the drift clock (i.e., the drift over time) of the memory cells that are in the set state may be reset. That is, the threshold voltage of memory cells in the set state may drop to an initial threshold voltage of the cell that was the threshold voltage prior to the drift of the memory cells in the set state. Specifically, when the memory cells in the set state are subjected to the read operation, then the memory cells may be thresholded because the read voltage that is applied to the memory cells may be above the relatively low threshold voltage of the memory cells in the set state.

Therefore, in some embodiments a "dummy-read" operation may be performed by the bias logic 130 on the memory cells prior to the actual read operation. In the dummy-read operation, the read voltage may be applied to the memory cells, but the actual state of the memory cells may not be identified based on that read voltage. Rather, the application of the read voltage during the dummy-read operation may serve to threshold the memory cells in the set state, that is reset the drift clock of those cells, so that the threshold voltage of those memory cells is returned to a pre-drift state. After the dummy-read operation is performed, and the memory cells in the set state are thresholded, then a normal read operation may be performed on the cells and the state of the memory cells may be identified. This process of performing a dummy-read prior to a normal read operation may be referred to as a double-read algorithm.

The application of the double-read operation may be seen in FIG. 2. Specifically, the initial threshold voltage of the memory cells in the set state may be represented by line 225. Application of the dummy-read voltage by the bias logic 130 may cause the threshold voltage of the cells in the set state to move from line 205 to line 225, as indicated by arrow 230.

In embodiments, the modified reset algorithm or the double-read algorithm may be performed by the bias logic 130 independently of one another, or in conjunction with one another. For example, if the modified reset algorithm and the double-read algorithm are performed in conjunction with one another, then the voltage window indicated by spacer 210 may be significantly increased at time t, as shown by spacer 235.

Figure 4:
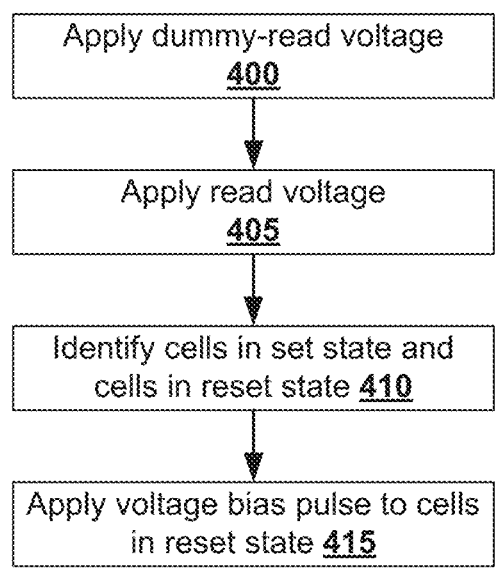
FIG. 4 illustrates an example of a modified reset process, in accordance with various embodiments.

FIG. 4 depicts an example process that may be performed by a bias logic 130 for performing the modified reset algorithm and the double-read algorithm in conjunction with one another. As described below, the bias logic will be discussed as performing the method, but in some embodiments it may be the memory controller 110, read/write module 120, or another element of, or entity associated with, the memory controller. Specifically, a dummy-read voltage may be applied by the bias logic 130 to one or more memory cells such as memory cells 112 at 400. As described above, the application of the dummy-read voltage may include applying voltage such as the read voltage (or another voltage) across the memory cells without identifying the state of each memory cell based on the application of the dummy-read voltage. The application of the dummy-read voltage may cause the memory cells in the set state to threshold, as described above.

Subsequent to the application of the dummy-read voltage at 400, the bias logic may then apply the read voltage across the memory cells at 405. Based on the application of the read voltage, the bias logic may identify the state of one or more of the memory cells as described above. Specifically, the bias logic may identify whether the memory cells are in the set state or the reset state at 410.

Finally, the bias logic may perform the modified reset algorithm. That is, the bias logic may apply a voltage bias pulse across one or more of the memory cells in the reset state to accelerate the bias drift of those memory cells at 415.

In the above embodiments, although bias logic 130 is described as applying one or more voltages such as a dummy-read voltage and/or voltage bias pulse, in some embodiments the bias logic 130 may not be applying the voltage itself, but may instead facilitate the application of the voltage to one or more cells 112 of the non-volatile memory 104. For example, in some embodiments the voltages may be physically sourced from a separate voltage source not shown in FIG. 1. In other embodiments, the bias logic 130 may directly apply the voltage to the one or more cells 112.

Figure 5:
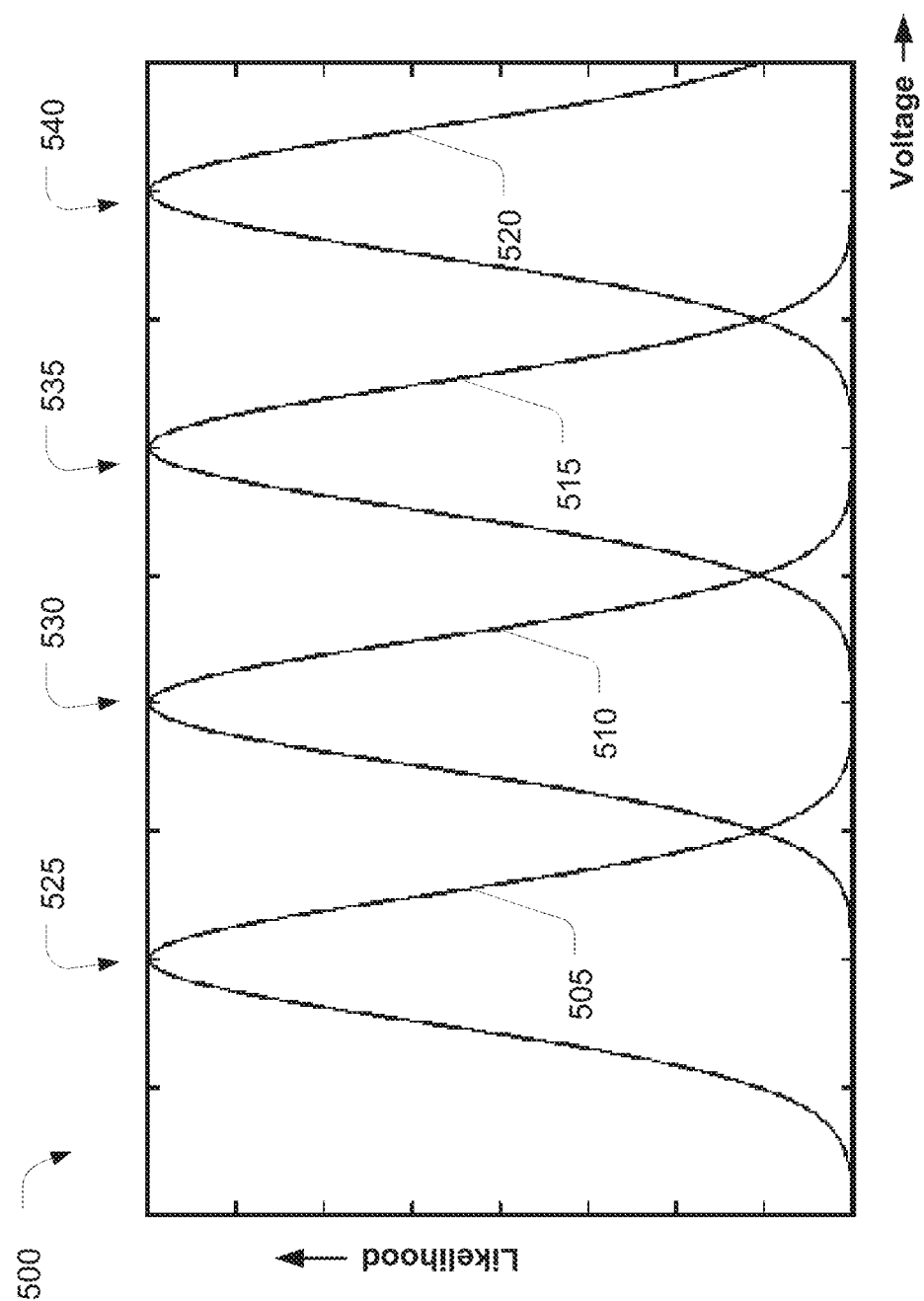
FIG. 5 illustrates an example of a memory cell that is programmable to a plurality of threshold voltages, in accordance with various embodiments.

In some embodiments, the memory cells may be multi-level cells (MLCs). That is, each memory cell may be able to hold more than two values. For example, in some embodiments each memory cell may be settable to $2^n$ threshold voltage levels in order to store n bits of data. FIG. 5 depicts an example of voltage thresholds for MLCs. Specifically, FIG. 5 depicts an example of PDFs of a plurality of memory cells in each state in a non-volatile memory. The x-axis depicts voltage, and the y-axis represents the likelihood that a cell in a given state will have a threshold voltage at a given voltage. Four separate states 505, 510, 515, and 520 are depicted in FIG. 5, and have a respective median threshold voltage at voltages 525, 530, 535, and 540.

In embodiments, the lowest level 505 may be the set state of the memory cell. The higher levels 510, 515, and 520 may be different reset states of the memory cell. In order to program the cell to one of the reset states 510, 515, or 520, the drift clock of a cell in a given state may be advanced using the modified reset algorithm. Specifically, a voltage bias pulse may be applied by the bias logic to a given cell to advance it to one of the reset states 510, 515, and 520. In some embodiments, the pulse length or pulse amplitude may be varied to distinguish between reset states 510, 515, or 520.

Figure 6:
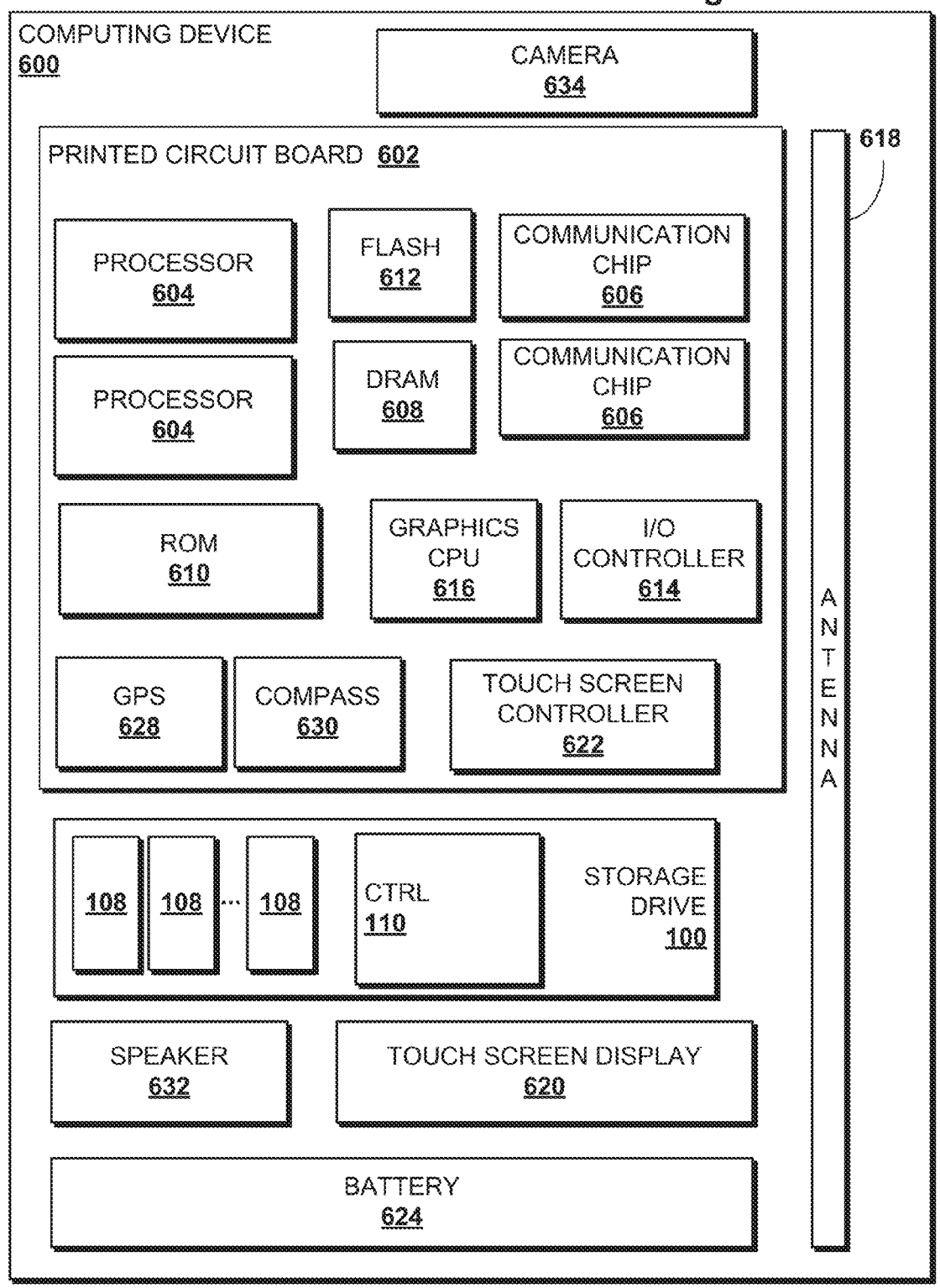
FIG. 6 illustrates an example system configured to perform the methods described herein, in accordance with various embodiments.

FIG. 6 illustrates an example computing device 600 in which systems such as earlier described non-volatile memory 104, memory controller 110 and/or read/write module 120 may be incorporated, in accordance with various embodiments. Computing device 600 may include a number of components, one or more processor(s) 604, non-volatile memory 104 in the form of one or more dies 108, memory controller 110, read/write module 120, and at least one communication chip 606.

In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computing device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computing device 600 may include other components that may or may not be physically and electrically coupled to the PCB 602. These other components include, but are not limited to, volatile memory (e.g., dynamic RAM (DRAM) 608), non-volatile memory such as ROM 610, an I/O controller 614, a digital signal processor (not shown), a crypto processor (not shown), a graphics processor 616, one or more antenna 618, a display (not shown), a touch screen display 620, a touch screen controller 622, a battery 624, an audio codec (not shown), a video codec (not shown), a global positioning system (GPS) device 628, a compass 630, an accelerometer (not shown), a gyroscope (not shown), a speaker 632, a camera 634, and a mass storage device (such as a hard disk drive, solid state drive, compact disk (CD), digital versatile disk (DVD)) (not shown), and so forth. In various embodiments, the processor 604 may be integrated on the same die with other components to form a System on Chip (SoC). In embodiments, one or both of the DRAM 608 and/or the ROM 610 may be or may include a non-volatile memory such as non-volatile memory 104, which may be respectively coupled with a memory controller such as memory controller 110.

In various embodiments, rather than or in addition to non-volatile memory 104, computing device 600 may include resident persistent or non-volatile memory, e.g., flash memory 612. In some embodiments, the one or more processor(s) 604 and/or flash memory 612 may include associated firmware (not shown) storing programming instructions configured to enable computing device 600, in response to execution of the programming instructions by one or more processor(s) 604, to practice all or selected aspects of the blocks described above with respect to FIG. 4. In various embodiments, these aspects may additionally or alternatively be implemented using hardware separate from the one or more processor(s) 604 or flash memory 612.

The communication chips 606 may enable wired and/or wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 802.20, General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a computing tablet, a personal digital assistant (PDA), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 600 may be any other electronic device that processes data.

EXAMPLES

Example 1 may include an apparatus comprising: a plurality of memory cells, wherein individual memory cells of the plurality of memory cells are configured to store one or more bits of data; a bias logic coupled with the individual memory cells, the bias logic to: identify, based on a current detected in response to application of a read voltage, a state of a bit of data in a memory cell of the individual memory cells; and apply, prior to the application of the read voltage, a dummy-read voltage to the memory cell.

Example 2 may include the apparatus of example 1, wherein the individual memory cells are in a set state or a reset state, and the memory bias logic is further configured to apply a voltage bias pulse to a memory cell in the reset state.

Example 3 may include the apparatus of example 2, wherein the bias logic is further configured to apply the voltage bias pulse to the memory cell immediately following performance of a memory reset operation on the memory cell.

Example 4 may include the apparatus of example 2, wherein the state of the bit of data in the memory cell is based on whether the read voltage is above or below a threshold voltage of the memory cell.

Example 5 may include the apparatus of example 2, wherein a time parameter or an amplitude parameter of the voltage bias pulse is based on a desired threshold voltage of the memory cell in the reset state.

Example 6 may include the apparatus of example 2, wherein the set state corresponds to a value of the bit of data equal to a first logical value, and the reset state corresponds to a value of the bit of data equal to a second logical value.

Example 7 may include the apparatus of any of examples 1-6, wherein the memory is a phase change memory (PCM).

Example 8 may include the apparatus of any of examples 1-6, wherein the individual memory cells are multi-level cells (MLCs).

Example 9 may include one or more non-transitory computer-readable media comprising instructions to cause an electronic device, upon execution of the instructions by one or more processors of the electronic device, to: identify, in a plurality of memory cells of a memory of an apparatus wherein individual memory cells of the plurality of memory cells have a threshold voltage, a memory cell that is in a reset state; and apply a voltage bias pulse to the memory cell based on a desired threshold voltage of the memory cell in the reset state, wherein application of the voltage bias pulse is different than application of a reset pulse to the memory cell.

Example 10 may include the one or more non-transitory computer-readable media of example 9, wherein the reset pulse includes application of an approximately constant current across the memory cell.

Example 11 may include the one or more non-transitory computer-readable media of example 9, wherein the individual memory cells in the plurality of memory cells are in the reset state or a set state, wherein the reset state corresponds to a first logic value and the set state corresponds to a second logic value.

Example 12 may include the one or more non-transitory computer-readable media of example 11, further comprising instructions to cause the electronic device, upon execution of the instructions by the one or more processors of the electronic device, to: apply a dummy-read voltage to the plurality of memory cells; and identify, based on a current detected in response to application of a read voltage to the plurality of memory cells subsequent to the application of the dummy-read voltage to the plurality of memory cells, the state of the individual memory cells in the plurality of memory cells.

Example 13 may include the one or more non-transitory computer-readable media of example 12, further comprising instructions to identify the state of the individual memory cells in the plurality of memory cells based on whether the read voltage is above or below the voltage threshold of the individual memory cells in the plurality of memory cells.

Example 14 may include the one or more non-transitory computer-readable media of any of examples 9-13, wherein the memory is a phase change memory (PCM).

Example 15 may include the one or more computer-readable media of any of examples 9-13, wherein the individual memory cells are multi-level cells (MLCs).

Example 16 may include a system comprising: a memory that includes a plurality of memory cells wherein individual memory cells in the plurality of memory cells are in a set state or a reset state and have a threshold voltage; a bias logic coupled with the memory cells, the bias logic to: apply a dummy-read voltage to the plurality of memory cells; identify, based on a current detected in response to application of a read voltage to the plurality of memory cells, a first subset of memory cells in the plurality of memory cells that are in the reset state and a second subset of memory cells in the plurality of memory cells that are in the set state; and apply a voltage bias pulse to the subset of memory cells that are in the reset state, wherein application of the voltage bias pulse is different than application of a reset pulse to the plurality of memory cells.

Example 17 may include the system of example 16, wherein the set state corresponds to a logic value of "1" and the reset state corresponds to a logic value of "0."

Example 18 may include the system of example 16, wherein the application of the voltage bias pulse accelerates a voltage drift of the subset of memory cells that are in the reset state.

Example 19 may include the system of example 16, wherein the application of the dummy-read voltage resets a voltage drift of the subset of memory cells that are in the set state.

Example 20 may include the system of example 16, wherein the application of the voltage bias pulse is based on a desired value of the threshold voltage of the subset of memory cells that are in the reset state.

Example 21 may include the system of example 20, wherein the application of the voltage bias pulse to the subset of memory cells that are in the reset state sets the threshold voltage of individual memory cells of the subset of memory cells that are in the reset state to one of two possible threshold voltages associated with the reset state.

Example 22 may include the system of any of examples 16-21, wherein the reset pulse includes application of an approximately constant current across the memory cell.

Example 23 may include the system of any of examples 16-21, wherein the memory is a phase change memory (PCM).

Example 24 may include the system of any of examples 16-21, wherein the individual memory cells are multi-level cells (MLCs).

Example 25 may include a method comprising: applying, by a bias logic coupled with a memory that includes a plurality of memory cells wherein individual memory cells in the plurality of memory cells are in a set state or a reset state and have a threshold voltage, a dummy-read voltage to the plurality of memory cells; identifying, by the bias logic based on a current detected in response to application of a read voltage to the plurality of memory cells, a first subset of memory cells in the plurality of memory cells that are in the reset state and a second subset of memory cells in the plurality of memory cells that are in the set state; and applying, by the bias logic, a voltage bias pulse to the subset of memory cells that are in the reset state, wherein application of the voltage bias pulse is different than application of a reset pulse to the plurality of memory cells.

Example 26 may include the method of example 25, wherein the set state corresponds to a logic value of "1" and the reset state corresponds to a logic value of "0."

Example 27 may include the method of example 25, wherein applying the voltage bias pulse accelerates a voltage drift of the subset of memory cells that are in the reset state.

Example 28 may include the method of example 25, wherein the applying the dummy-read voltage resets a voltage drift of the subset of memory cells that are in the set state.

Example 29 may include the method of example 25, wherein the applying the voltage bias pulse is based on a desired value of the threshold voltage of the subset of memory cells that are in the reset state.

Example 30 may include the method of example 29, wherein the applying the voltage bias pulse to the subset of memory cells that are in the reset state sets the threshold voltage of individual memory cells of the subset of memory cells that are in the reset state to one of two possible threshold voltages associated with the reset state.

Example 31 may include the method of any of examples 25-30, wherein the reset pulse includes application of an approximately constant current across the memory cell.

Example 32 may include the method of any of examples 25-30, wherein the memory is a phase change memory (PCM).

Example 33 may include the method of any of examples 25-30, wherein the individual memory cells are multi-level cells (MLCs).

Example 34 may include one or more non-transitory computer-readable media comprising instructions to cause a bias logic, upon execution of the instructions by one or more processors coupled with the bias logic, to perform the method of any of examples 25-33.

Example 35 may include an apparatus comprising means to perform the method of any of examples 25-33.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. An apparatus comprising:
a plurality of memory cells, wherein individual memory cells of the plurality of memory cells are configured to store one or more bits of data; and
a bias logic coupled with the individual memory cells, the bias logic to:
apply a dummy-read voltage to the plurality of memory cells, to return the plurality of memory cells that are in a set state to a voltage pre-drift state;
apply, subsequent to application of the dummy-read voltage, a read voltage to the plurality of memory cells;
apply a voltage bias pulse to a subset of the plurality of memory cells in a reset state, as a result of the application of the read voltage, to accelerate a voltage drift of the memory cells in the reset state.

2. The apparatus of claim 1, wherein the bias logic is to identify, based on a current detected in response to application of the read voltage, a subset of the memory cells that are in the reset state.

3. The apparatus of claim 2, wherein the bias logic is further configured to apply the voltage bias pulse to the subset of the plurality of memory cells immediately following performance of a memory reset operation on the plurality of memory cells.

4. The apparatus of claim 1, wherein a state of the bit of data in a memory cell of the plurality of memory cells is based on whether the read voltage is above or below a threshold voltage of the memory cell.

5. The apparatus of claim 1, wherein a time parameter or an amplitude parameter of the voltage bias pulse is based on a desired threshold voltage of a memory cell in the reset state.

6. The apparatus of claim 1, wherein the set state corresponds to a value of the bit of data equal to a first logical value, and the reset state corresponds to a value of the bit of data equal to a second logical value.

7. The apparatus of claim 1, wherein a memory formed by the plurality of memory cells is a phase change memory (PCM).

8. The apparatus of claim 1, wherein the individual memory cells are multi-level cells (MLCs).

9. One or more non-transitory computer-readable media comprising instructions to cause an electronic device, upon execution of the instructions by one or more processors of the electronic device, to:
apply, to a plurality of memory cells of a memory of an apparatus, a dummy-read voltage, to return those of the plurality of memory cells that are in a set state to a voltage pre-drift state, wherein individual memory cells of the plurality of memory cells have a threshold voltage, wherein the individual memory cells in the plurality of memory cells are in a reset state or the set state;
apply, subsequent to application of the dummy-read voltage, a read voltage to the plurality of memory cells;
identify, based on a current detected in response to application of the read voltage, a subset of the individual memory cells that are in the reset state; and
apply a voltage bias pulse to the subset of the individual memory cells in the reset state, to accelerate a voltage drift of the memory cells in the reset state to achieve the threshold voltage, based on a desired threshold voltage of the memory cell in the reset state, wherein application of the voltage bias pulse is different than application of a reset pulse to the plurality of memory cells.

10. The one or more non-transitory computer-readable media of claim 9, wherein the reset pulse includes application of an approximately constant current across a memory cell.

11. The one or more non-transitory computer-readable media of claim 9, wherein the reset state corresponds to a first logic value and the set state corresponds to a second logic value.

12. The one or more non-transitory computer-readable media of claim 11, further comprising instructions to identify the state of the individual memory cells in the plurality of memory cells based on whether the read voltage is above or below the voltage threshold of the individual memory cells in the plurality of memory cells.

13. The one or more non-transitory computer-readable media of claim 9, wherein the memory is a phase change memory (PCM).

14. The one or more computer-readable media of claim 9, wherein the individual memory cells are multi-level cells (MLCs).

15. A system comprising:
a memory that includes a plurality of memory cells wherein individual memory cells in the plurality of memory cells are in a set state or a reset state and have a threshold voltage;
a bias logic coupled with the memory cells, the bias logic to:
apply a dummy-read voltage to the plurality of memory cells, to return those of the plurality of memory cells that are in the set state to a voltage pre-drift state;
apply, subsequent to application of the dummy-read voltage, a read voltage to the plurality of memory cells;
identify, based on a current detected in response to application of a read voltage to the plurality of memory cells, a first subset of memory cells in the plurality of memory cells that are in the reset state and a second subset of memory cells in the plurality of memory cells that are in the set state; and
apply a voltage bias pulse to the subset of memory cells that are in the reset state, to accelerate a voltage drift of the memory cells in the reset state to achieve the threshold voltage, wherein application of the voltage bias pulse is different than application of a reset pulse to the plurality of memory cells.

16. The system of claim 15, wherein the set state corresponds to a logic value of "1" and the reset state corresponds to a logic value of "0".

17. The system of claim 15, wherein the application of the dummy-read voltage resets a voltage drift of the subset of memory cells that are in the set state.

18. The system of claim 15, wherein the application of the voltage bias pulse is based on a desired value of the threshold voltage of the subset of memory cells that are in the reset state.

19. The system of claim 18, wherein the application of the voltage bias pulse to the subset of memory cells that are in the reset state sets the threshold voltage of individual memory cells of the subset of memory cells that are in the reset state to one of two possible threshold voltages associated with the reset state.

20. The system of claim 15, wherein the reset pulse includes application of an approximately constant current across the memory cell.

21. The system of claim 15, wherein the memory is a phase change memory (PCM).

22. The system of claim 15, wherein the individual memory cells are multi-level cells (MLCs).

* * * * *